US008862759B2

(12) United States Patent
Schneider et al.

(10) Patent No.: US 8,862,759 B2
(45) Date of Patent: Oct. 14, 2014

(54) MULTIPLEXING BINARY ENCODING TO FACILITATE COMPRESSION

(75) Inventors: John C. Schneider, Bellevue, WA (US); Richard A. Rollman, Sammamish, WA (US); Milen Nankov, Sammamish, WA (US); Ethan Hugg, Seattle, WA (US)

(73) Assignee: AgileDelta, Inc., Bellevue, WA (US)

( * ) Notice: Subject to any disclaimer, the term of this patent is extended or adjusted under 35 U.S.C. 154(b) by 294 days.

(21) Appl. No.: 11/398,112

(22) Filed: Apr. 5, 2006

(65) Prior Publication Data

US 2007/0239881 A1 Oct. 11, 2007

(51) Int. Cl.
| G06F 15/16 | (2006.01) |
| H04N 19/46 | (2014.01) |
| H04L 29/06 | (2006.01) |
| H04N 19/12 | (2014.01) |
| H03M 7/30 | (2006.01) |
| H04N 21/235 | (2011.01) |
| H04N 21/435 | (2011.01) |

(52) U.S. Cl.
CPC ........ *H04L 65/601* (2013.01); *H04N 19/00545* (2013.01); *H04N 19/00078* (2013.01); *H03M 7/30* (2013.01); *H04N 21/235* (2013.01); *H04N 21/435* (2013.01); *H04N 21/2353* (2013.01)
USPC ............................ 709/231; 709/230; 709/232

(58) Field of Classification Search
CPC ........................................................ H04L 29/06
USPC .......................................... 709/231, 230, 232
See application file for complete search history.

(56) References Cited

U.S. PATENT DOCUMENTS

| 6,012,062 | A * | 1/2000 | Jagadish et al. .............. 707/101 |
| 2002/0116715 | A1* | 8/2002 | Apostolopoulos .............. 725/86 |
| 2003/0123071 | A1* | 7/2003 | Eldridge et al. .............. 358/1.9 |
| 2003/0225997 | A1* | 12/2003 | Kirovski et al. .............. 712/210 |
| 2004/0139396 | A1* | 7/2004 | Gelernter et al. .............. 715/515 |
| 2005/0232497 | A1* | 10/2005 | Yogeshwar et al. .......... 382/232 |
| 2008/0022343 | A1* | 1/2008 | Hodzic et al. .................. 725/115 |

OTHER PUBLICATIONS

International Search Report and Written Opinion of the International Searching Authority for PCT/US07/65972 dated Jul. 28, 2008 (7 pages).

* cited by examiner

*Primary Examiner* — Noel Beharry
*Assistant Examiner* — Abdelnabi Musa
(74) *Attorney, Agent, or Firm* — Schwabe Williams & Wyatt PC

(57) ABSTRACT

Methods, apparatuses, and articles of manufacture for receiving a stream of data, splitting the stream of data into a plurality of substreams based on one or more criteria, and selectively recombining the substreams based on one or more additional criteria, to improve overall effectiveness in compressing the stream of data, are described herein.

23 Claims, 6 Drawing Sheets

MULTIPLEXING BINARY ENCODING TO FACILITATE COMPRESSION

STATEMENT REGARDING GOVERNMENT SPONSORED RESEARCH OR DEVELOPMENT

This invention was made with government support under contract FA8750-06-C-0038 awarded by The Air Force Research Lab. The government has certain rights in the invention.

TECHNICAL FIELD

Embodiments of the present invention relate to the field of data processing, in particular, to multiplexing a stream of data and combining two or more of the multiplexed substreams to facilitate compression of the stream of data.

BACKGROUND

Various encoding and decoding techniques have been developed and employed to facilitate efficient storage and/or transfer of data, e.g. media data, such as video and/or audio data.

Increasingly, the Extensible Markup Language (XML) has become the standard for sharing data over networks such as the Internet. With advances in networking, processor speed, memory, and client server/architecture enabling increased information sharing, the need for a language representing data in a platform independent manner became increasingly clear. Though capable of connecting to each other over the Internet and other networks, many computing devices struggled to share data due to their differing platforms. XML answered this need by separating data from programming and display language specific requirements, and facilitating the representation of the data itself and its structure, utilizing "elements" that described the data in a nested fashion (see FIG. 5b for an example of XML).

XML has become so prevalent that numerous other languages and standards based on XML have been developed. These languages and standards include XSL (the Extensible Stylesheet Language), which describes how an XML document is to be displayed; XSLT (Extensible Stylesheet Language Transformations), which transforms XML documents into other XML documents or into XHTML documents (Extensible Hypertext Markup Language); XPath, which is a language for finding information in an XML document; XQuery, which facilitates the querying of XML documents; DTD (Document Type Definition), which defines the legal building blocks (elements) of an XML document; and XML Schema Language, which serves as an XML-based alternative to DTDs, declaring elements that may occur in an XML document and the order of their occurrence. Numerous application interfaces, such as the XML DOM (Document Object Model), have also arisen, facilitating the accessing and manipulating of XML documents.

Given the increasing processor speeds of personal computers and workstations and the increasing use of fast, efficient broadband network connections, the large size of XML documents has not always been seen as a problem. However, from XML's inception, it has been recognized that its very large size (relative to its content) would be problematic for computer systems and enterprises that have high efficiency needs. With the revolution in small, mobile device technology, the problems of XML efficiency have become more acute. Mobile devices are limited by their size to smaller storage, memory, and bandwidth. An XML document that might not overwhelm a PC on a broadband connection might pose serious problems for a cell phone or PDA. For these devices, large XML files take too long to download, require too much memory and require lengthy processing times, draining the device's battery. In addition, providers of network connectivity for some of these devices bill for the amount of data transferred rather than the amount of time connected, leading to increasingly large bills for mobile devices. Thus, the large size and situational inefficiency of XML are becoming problematic.

In response, a number of application-specific and proprietary tools for reducing the size of XML have been developed. Such tools include ASN-1, WAP WB-XML, Millau, and compression tools such as Win-Zip. None of these tools, however, provides an efficient version of XML that works well for the full range of XML, including small documents, large documents, strongly typed data and loosely typed documents. In addition, none of them support the extensibility and flexibility required by XML applications and none of them scale well for a wide range of small, mobile devices and large, high-processing power devices.

BRIEF DESCRIPTION OF THE DRAWINGS

Embodiments of the present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Illustrative embodiments of the present invention include but are not limited to methods and apparatuses for receiving a stream of data, splitting the stream of data into a plurality of substreams based on one or more criteria, and selectively recombining the substreams based on one or more additional criteria, to improve overall effectiveness in compressing the stream of data.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(B) or (A B)", that is, A is optional.

Figure 1:
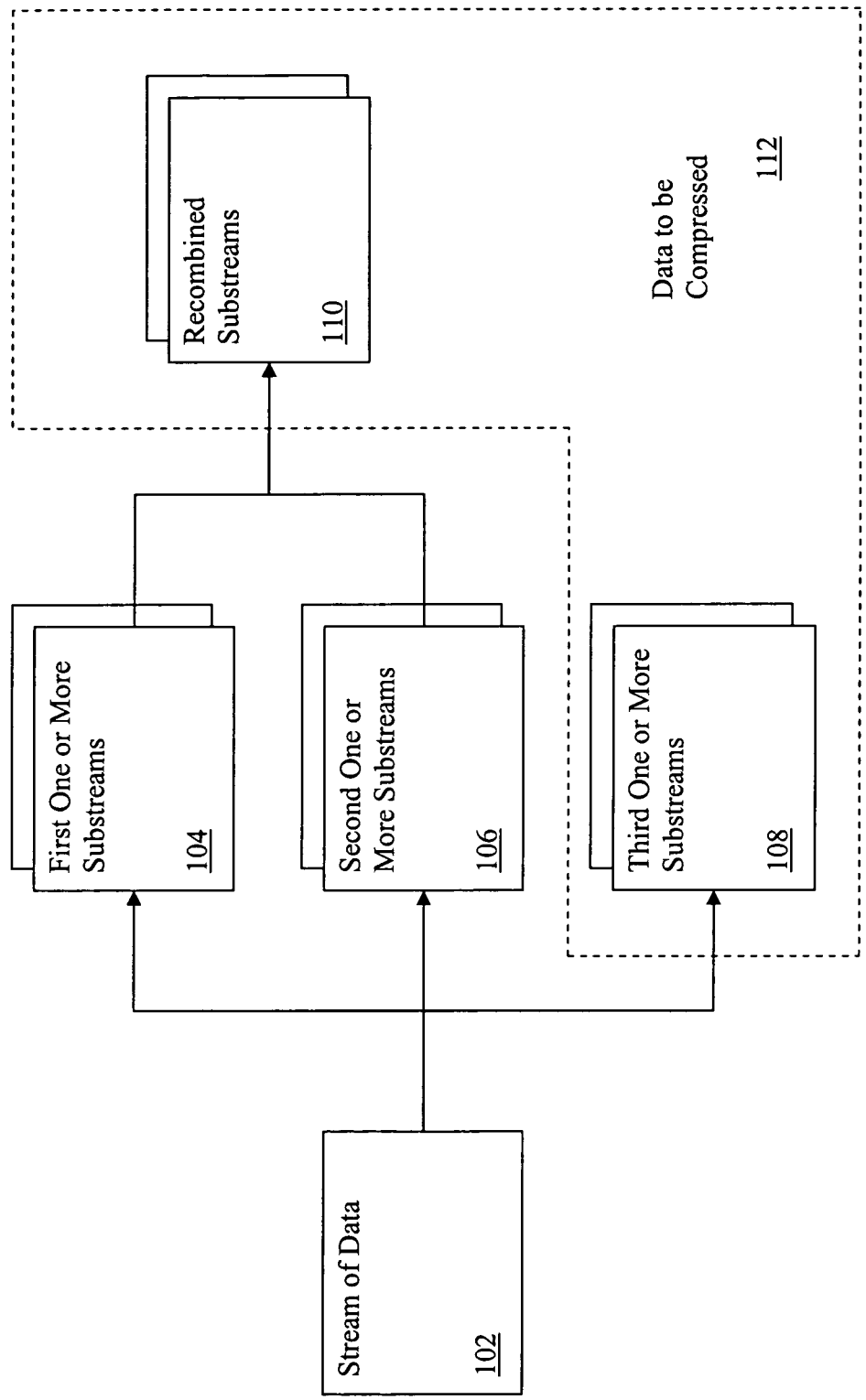
FIG. 1 illustrates an overview of the invention, in accordance with various embodiments.

FIG. 1 illustrates an overview of the present invention, in accordance with various embodiments. As illustrated, the processes of receiving a stream of data, such as stream of data 102, determining a plurality of substreams of data from the stream of data 102, splitting stream of data 102 into the plurality of substreams, such as first one or more substreams 104, second one or more substreams 106, and third one or more substreams 108, based on one or more criteria, selectively recombining the substreams based on one or more additional criteria, and separately compressing some or all of the substreams and recombined substreams may all be implemented on the same computer system, on a plurality of computer systems, and even on separate computer systems, as a distributed process or processes. Some or all of the computer systems may be connected by one or more networks, and the networks may be of any type known in the art, such as local area networks (LANs), wide area networks (WANs) or the Internet.

Further, the computer system or systems having one or more of the above processes may be of any type known in the art, including, but not limited to, PCs, workstations, servers, routers, mainframes, PDAs, set-top boxes, and mobile phones. Further, the network connecting any two or more of these systems may be any sort of network known in the art, including, but not limited to, a LAN, a WAN, or the Internet. Such a network may additionally utilize any sort of connection known in the art, such as a TCP/IP connection or an ATM virtual connection.

In various embodiments, stream of data 102 may be received via an application interface (API), the interface providing a stream of data from one or more processes, such as an encoder. The API (not shown) may represent any sort of API known in the art. The API may conform to one or more of the XML DOM, Simple API for XML (SAX), Streaming API for XML (StAX) and Java API for XML Binding (JAXB).

Stream of data 102, in some embodiments, may be generated by an encoder, although stream 102 may be generated by any sort of process or processes. Such an encoder may generate a plurality of smaller and/or lower entropy encoding values representing larger and/or higher entropy data, such as XML. Such an encoder is the subject of co-pending application Ser. No. 11/394,662, entitled "KNOWLEDGE BASED ENCODING OF DATA," filed on Mar. 31, 2006.

The data comprising stream of data 102 may be any sequence of zero, one, or more bits, and may or may not have a structure. In various embodiments, stream of data 102 is structured as XML data, character data, data from a database, structures defined by a programming language, and/or structures defined by an interface definition language (IDL). Further, data items specified by the structure of stream of data 102 and contained within stream of data 102 may be one or more of the data types integer, long, short, byte, string, date, Boolean, float, double, qualified name, byte array, and/or typed list. Further, as mentioned above, the stream of data 102 having any one or more of the above structures and/or data types may be encoded by an encoder as a plurality of encoded values representing the data.

Additionally, in some embodiments, the API or process(es) providing the stream of data 102 may provide the stream as a one or more byte-aligned values. By providing the stream of data 102 as one or more byte-aligned values, the API or process(es) providing the stream of data 102 may facilitate compression algorithms that identify, analyze and operate on data items that occur on byte boundaries, such as the Deflate algorithm, that may compress the data to be compressed 112.

As is further illustrated, first one or more substreams 104, second one or more substreams 106, and third one or more substreams 108 may be determined in any of a number of ways. A computer system or systems determining a plurality of data substreams such as substreams 104, 106, and 108 may determine the streams randomly, placing portions of stream of data 102 at random into any number of substreams, the substreams acting as "buckets" for the portions of the stream 102 allocated into them.

In other embodiments, stream of data 102 may be split into a plurality of substreams 104, 106, and 106 based on one or more pre-determined criteria, to improve overall effectiveness in compressing the stream of data 102. The one or more criteria may comprise metadata describing the content and/or structure of stream of data 102, and the metadata may have any number of sources. The metadata may be derived from the data itself and/or one or more descriptions of the data. The metadata may be derived from one or more of names associated with data items, types associated with data items and/or the content of data items. Where the metadata is derived from an XML document, the metadata serving as the one or more criteria may include element names and/or attribute names. Where the metadata is derived from an XML schema, the one or more criteria may include data type names associated with XML elements, attributes and values, or base data types associated with XML elements, attributes or values, such as "String" and "Integer." Where the metadata is derived from a database schema or database data, the one or more criteria may include names or types associated with database tables, rows, and/or columns. Further, the metadata may be derived from other sources of metadata known in the art, such as grammars and/or programming languages, and the one or more criteria may include names and/or types associated with grammar productions and/or structures defined by a programming language.

For example, if the one or more criteria comprise the base data types of portions of stream of data 102, the stream 102 may be split into a plurality of substreams, with characters in one substream, strings in another, integers in a third, and reserve yet another for other or unknown data types. Thus, a stream of data 102, "a 1 2 b cat c 3 a b rabbit 1 c 2 3 3. 14 . . . " might be placed into the following substreams: "a b c a b c . . . " "1 2 3 1 2 3 . . . " "cat rabbit . . . " and "3.14 . . . ", which each have lower entropy than the original stream and may compress better separately than together (assuming longer sequences than illustrated in the simple example above).

Figure 4A:
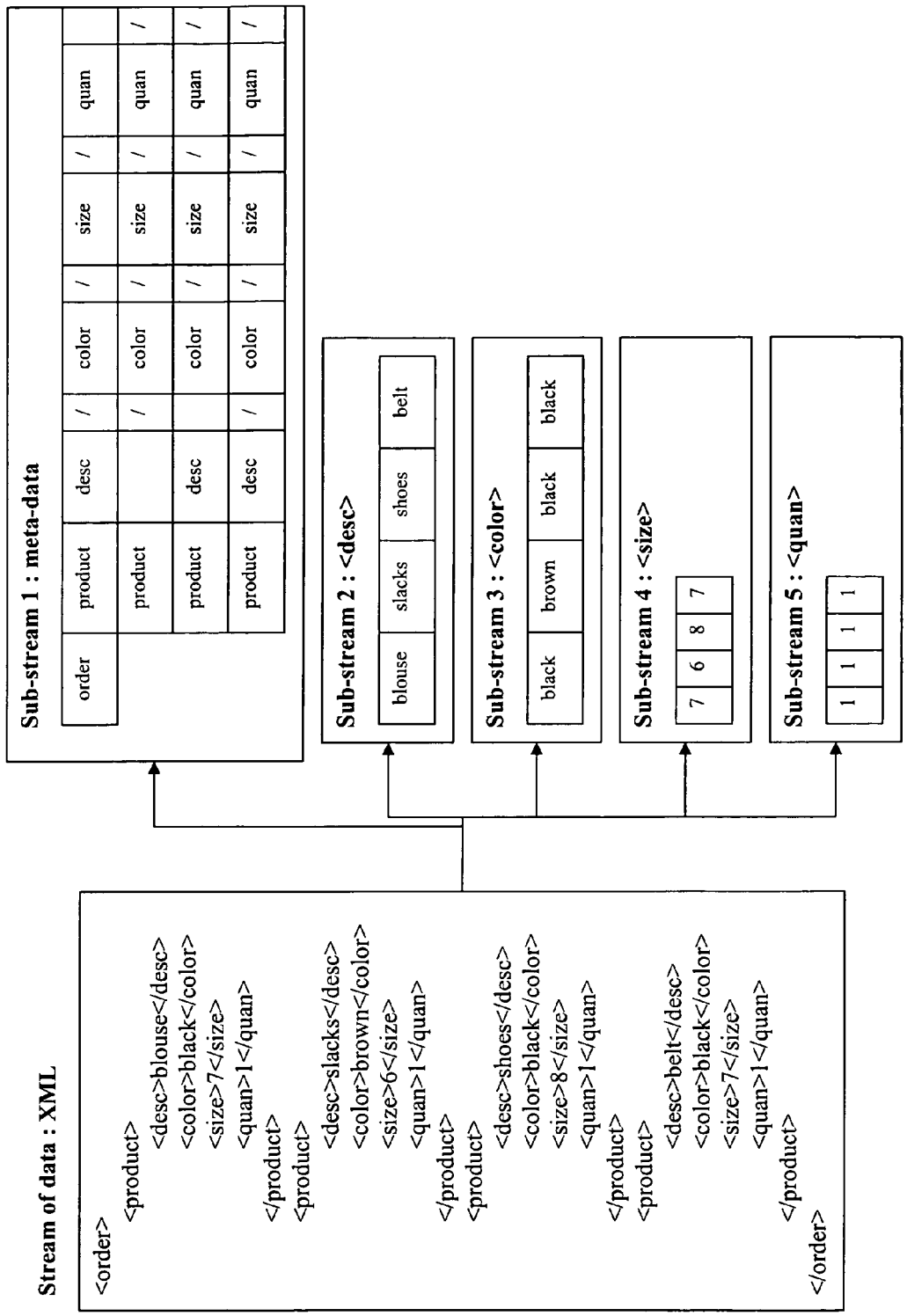
FIGS. 4a-4b illustrate exemplary substreams of data generated from the received stream of data, as well as recombined substreams generated by combining two or more of the substreams, in accordance with various embodiments.

In yet other embodiments, the computer system or systems determining the plurality of substreams 104, 106, and 108 may derive and/or receive metadata describing one or more of the structure, names, types and content of data items in stream of data 102. Metadata may be derived from the data itself and/or any description of the data, such as the XML schemas, database schemas, grammars, and programming languages mentioned above. Such metadata may be provided separately, provided at the beginning of the stream 102 or may, in some embodiments, be derived while performing an initial pass through at least a portion of stream of data 102, extracting the metadata before or while determining the plurality of substreams to generate. In some embodiments, the computer system or systems determining the plurality of substreams, may specify a substream (e.g., the first substream) representing said metadata, such that a decoder may read the specified substream to retrieve said metadata and determine the criteria needed to decode the remaining substreams. In one embodiment, the specified substream containing a representation of said metadata is output and/or compressed concurrently with the first pass through of at least a portion of stream of data 102. For example, FIG. 4a illustrates an example stream of data 102 containing an XML document, wherein the XML element names provide metadata defining the sequence and structure of data items in stream of data 102 and sub-stream 1 contains a representation of the metadata in one embodiment. While making an initial pass through stream of data 102, a computer system performing the determining processes may collect the metadata, identifying the order in which specific elements, attributes, and values occur, and creating separate substreams for each element/attribute name encountered to hold the associated element/attribute values. Thus, referring to stream of data 102 in FIG. 4a, a computer system making an initial pass may create a first substream for the metadata and separate substreams for each element/attribute name that has at least one associated value, i.e., <desc>, <color>, <size> and <quan>. Upon completion of at least a partial pass through, the computer system or another system may split stream of data 102 into substreams 104, 106, and 108 in accordance with the element/attribute names.

The derivation and receipt of metadata is further discussed in "KNOWLEDGE BASED ENCODING OF DATA," the co-pending application cited above.

Once a computer system or systems have determined the plurality of substreams 104, 106, and 108, that computer system or another system connected in the manner described above may split stream 102 into the plurality of substreams. The substreams may be created and implemented as any number of data structures, including buffers, streams, arrays, queues, and stacks, but may be implemented in any manner known in the art. Taking the example of a series of arrays, the substream splitting process may first call a function or functions initializing an array or arrays for each of the substreams. Thus, referring to the above example, the process might initialize arrays for portions of the stream 102 representing metadata and values of the <desc>, <color>, <size> and <quan> elements. Upon initializing the arrays or other data structures representing the substreams, the substream splitting process may read the received stream of data 102 from the beginning of the stream to its end. As the process encounters portions of data, the process will store the portion in, for example, the initialized array associated with the metadata or a particular element name associated with the portion of data. Referring to the example in FIG. 4a, first the <order> tag, would be read, and would be stored at the beginning of the metadata array. Then the <product> and <desc> tags would be read, and would be stored in the next positions in the metadata array. Then, the element value "blouse" would be read and stored at the beginning of the "<desc>" array. In addition, a value indicator might be written to the structure stream indicating that an element or attribute value occurred at that position in the stream (indicated in FIG. 4a by the symbol "/"). Following that, a <color> tag would be read and stored in the metadata array, the element value "black" would be read and stored at the beginning of the "<color>" array and so on.

In some embodiments, each of the plurality of substreams 104, 106, and 108 may be assigned one or more identifiers based on metadata describing the stream 102. The one or more identifiers may then be used to facilitate selective recombining of the substreams of data, the selective recombining described in greater detail below.

Further, prior to recombining the substreams 104, 106, and 108, two or more of the substreams may be reordered based on one or more reordering criteria so that substreams that are likely to compress well together are adjacent. The one or more reordering criteria used for reordering two or more of the substreams may include one or more of identifiers associated with substreams, sizes associated with substreams (e.g., in bytes or number of data items), data types associated with data from substreams, names associated with data from the substream, and analysis results associated with the data of the substream, such as statistical averages of values in a substream, entropies of substreams, ranges of values in substreams, and frequency distributions of values in sub streams.

In various embodiments, one or more values of one or more of the plurality of substreams 104, 106, and 108 may also be modified based on one or more criteria to improve the relative entropy of one or more pairs of substreams. For example, a constant value may be added to values in one or more substreams, to reduce differences in their average values, entropies, value ranges, or frequency distributions. As another example, the criteria may also comprise a map that maps each original value to a different value.

As is shown, two or more of the plurality of substreams may be recombined to form one or more recombined substreams 110 based on one or more criteria, to improve overall effectiveness in compressing the stream of data 102. In various embodiments, the one or more criteria may include identifiers associated with the substreams, such as those mentioned above; sizes associated with the substreams, such as a substream's size in byte or length in values; data types associated with data from substreams; names associated with data from substream; and analysis results of the data of the substreams, such as statistical averages of values in a substream, entropies of substreams, ranges of values in substreams, and frequency distributions of values in substreams. Substreams may be successively recombined with other adjacent or non-adjacent substreams until the one or more criteria are met. Recombined substreams themselves may be recombined with other adjacent or non-adjacent substreams or with other recombined substreams until all substreams and recombined substreams meet the one or more criteria.

For example, if one of the one or more criteria is a substream length, the recombination process may begin by performing a function call to a method that returns a substream length. Upon determining substream lengths (methods for which are well known in the art), substreams having a length that is smaller than the criterion might be combined. If the criterion is that the length of each substream should be greater than one hundred items, for example, any substreams having a length that is less than one hundred items would be recombined into recombined substreams 110. The recombined substreams 110 themselves may be recombined, either further with other recombined substreams 110, or with substreams 104, 106, and/or 108, until all substreams and recombined substreams satisfy the substream length criteria or until only one substream remains. Referring now to the above example in FIG. 4b, if the minimum substream length is set at five, substream 2 ("<desc>") with a length of four data items and substream 3 ("<color>") with a length of four data items may be combined to form combined substream 1 with a substream length of eight data items. Further, substream 4 with a length of four data items and substream 5 with a length of four data items might also be combined to form combined substream 2 with eight data items.

Further, the implementation of the combination process may involve the creation of a new buffer, stream, array, stack, or queue, or may involve the addition of items from one existing buffer, stream, array, stack, or queue to another existing array, stack, or queue.

Also, in various embodiments, after reordering the plurality of substreams, all of the substreams may be recombined into a single recombined stream, the recombined stream compressing better than stream 102 because it now includes repeating sequences of similar adjacent items.

As is further illustrated, upon recombining the substreams into the one or more recombined substreams 110, a computer system or systems may compress the substreams 108 that have not been recombined, and the recombined substreams 110. Thus, the data to be compressed 112 includes both substreams that have not been recombined and recombined substreams 110. The compression process may be facilitated by any compression algorithm known in the art, such as Huffman, Lempel-Ziv, or Deflate. These algorithms are well known to those skilled in the art, however, and the details of their implementations need not be described further. In one embodiment, a computer system or systems may determine that one or more substreams should not be compressed at all. The determination whether to compress a particular stream or substream may be made based on metadata. The metadata may be derived from a number of sources and may include identifiers associated with substreams, sizes associated with substreams (e.g., in bytes or number of data items), data types associated with data from substreams, names associated with data from the substream, and analysis results associated with the data of the substream, such as statistical averages of values in a substream, entropies of substreams, ranges of values in substreams, and frequency distributions of values in substreams.

In various embodiments, after compressing the data to be compressed 112, the computer system or systems may transmit the data 112 to another computer system or store data 112. Such transmission or storage may be facilitated by one or more networking fabrics, such as LANs, WANs, or the Internet, or by a storage medium capable of storing the data 112. In one embodiment substreams (compressed and/or uncompressed) may be concatenated as a single stream for transmission or storage. In other embodiments, substreams may be transmitted or stored separately.

Figure 2:
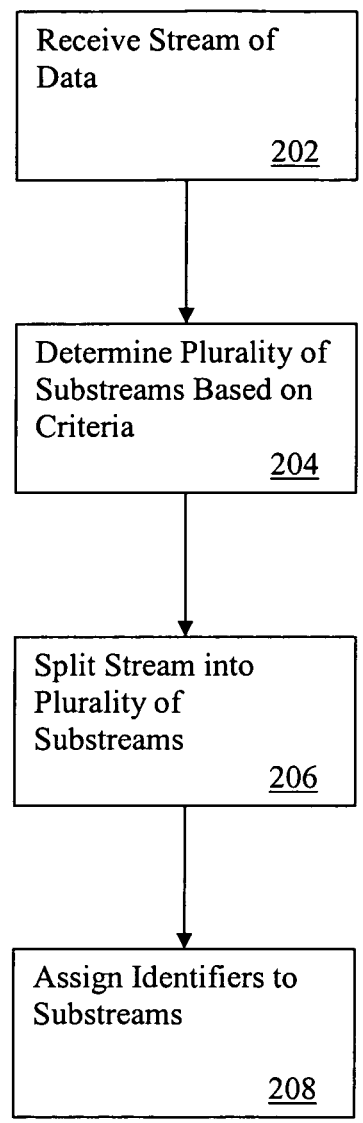
FIG. 2 illustrates a flow chart view of substream determining and generating operations of the present invention, in accordance with various embodiments.

FIG. 2 illustrates a flow chart view of substream determining and generating operations of the present invention, in accordance with various embodiments. As illustrated, the stream of data 102 may first be received by a computer system performing some or all of the operations of the present invention, block 202. In various embodiments, the stream of data 102 may be received via an application interface (API) (not shown), the interface providing a stream of data from one or more processes, such as an encoder. The API may represent any sort of API known in the art. The API may conform to one or more of the XML DOM, Simple API for XML (SAX), Streaming API for XML (StAX) and Java API for XML Binding (JAXB).

The received stream of data 102, block 202, may be generated by an encoder (not shown), although stream 102 may be generated by any sort of process or processes. Such an encoder may generate a plurality of smaller and/or lower entropy encoding values representing larger and/or higher entropy data, such as XML. Such an encoder is the subject of "KNOWLEDGE BASED ENCODING OF DATA," the co-pending application cited above.

Further, the data comprising stream of data 102 may be any sequence of zero, one, or more bits, and may or may not have a structure. In various embodiments, stream of data 102 is structured as XML data, character data, data from a database, structures defined by a programming language, and/or structures defined by an interface definition language (IDL). Additionally, data items contained within stream of data 102 may be one or more of the data types integer, long, short, byte, string, date, Boolean, float, double, qualified name, byte array, and/or typed list. And as mentioned above, the stream of data 102 having any one or more of the above structures and/or data types may be encoded by an encoder as a plurality of encoded values representing the data.

Additionally, in some embodiments, the stream of data 102 may be received as one or more byte aligned values, block 202, from the API or process(es) providing the stream 102. By providing the stream of data 102 as one or more byte-aligned values, the API or process(es) providing the stream of data 102 may facilitate compression algorithms that identify, analyze, and operate an data items that occur on byte boundaries, such as the Deflate algorithm, that may compress the data to be compressed 112.

As is further illustrated, first one or more substreams 104, second one or more substreams 106, and third one or more substreams 108 may be determined in any of a number of ways, block 204. A computer system or systems determining a plurality of data substreams such as substreams 104, 106, and 108 may determine the streams randomly, placing portions of stream of data 102 at random into any number of substreams, the substreams acting as "buckets" for the portions of the stream 102 allocated into them.

In other embodiments, stream of data 102 may be split into a plurality of substreams 104, 106, and 106 based on one or more pre-determined criteria, to improve overall effectiveness in compressing the stream of data 102, block 204. The one or more criteria may comprise metadata describing the content and/or structure of stream of data 102, and the metadata may have any number of sources. The metadata may be derived from the data itself and/or one or more descriptions of the data. The metadata may be derived from one or more of names associated with data items, types associated with data items, and/or the content of data items. Where the metadata is derived from an XML document, the metadata serving as the one or more criteria may include element names and/or attribute names. Where the metadata is derived from an XML schema, the one or more criteria may include data type names associated with XML elements, attributes and values, or base data types associated with XML elements, attributes, or values, such as "String" and "Integer." Where the metadata is derived from a database schema or database data, the one or more criteria may include names or types associated with database tables, rows, and/or columns. Further, the metadata may be derived from other sources of metadata known in the art, such as grammars and/or programming languages, and the one or more criteria may include names and/or types associated with grammar productions and/or structures defined by a programming language.

For example, if the one or more criteria comprise the base data types of portions of stream of data 102, the stream 102 may be split into a plurality of substreams, with characters in one substream, strings in another, integers in a third, and reserve yet another for other or unknown data types. Thus, a stream of data 102, "a 1 2 b cat c 3 a b rabbit 1 c 2 3 3.

14 . . . " might be placed into the following substreams: "a b c a b c . . . " "1 2 3 1 2 3 . . . " "cat rabbit . . . " and "3.14 . . . ", which each have lower entropy than the original stream and may compress better separately than together (assuming longer sequences than illustrated in the simple example above).

In yet other embodiments, the computer system or systems determining the plurality of substreams 104, 106, and 108 may derive and/or receive metadata describing one or more of the structure, names, types, and content of data items in stream of data 102, the metadata serving as the one or more criteria for determining the plurality of substreams, block 204. Metadata may be derived from the data itself and/or any description of the data, such as the XML schemas, database schemas, grammars, and programming languages mentioned above. Such metadata may be provided separately, provided at the beginning of the stream 102 or may, in some embodiments, be derived while performing an initial pass through at least a portion of stream of data 102, extracting the metadata before or while determining the plurality of substreams to generate. In some embodiments, the computer system or systems determining the plurality of substreams, may specify a substream (e.g., the first substream) representing said metadata, such that a decoder may read the specified substream to retrieve said metadata and determine the criteria needed to decode the remaining substreams. In one embodiment, the specified substream containing a representation of said metadata is output and/or compressed concurrently with the first pass through of at least a portion of stream of data 102. For example, FIG. 4a illustrates an example stream of data 102 containing an XML document, wherein the XML element names provide metadata defining the sequence and structure of data items in stream of data 102 and sub-stream 1 contains a representation of the metadata in one embodiment. While making an initial pass through stream of data 102, a computer system performing the determining processes may collect the metadata, identifying the order in which specific elements, attributes, and values occur, and creating separate substreams for each element/attribute name encountered to hold the associated element/attribute values. Thus, referring to stream of data 102 in FIG. 4a, a computer system making an initial pass may create a first substream for the metadata and separate substreams for each element/attribute name that has at least one associated value, i.e. <desc>, <color>, <size> and <quan>. Upon completion of at least a partial pass through, the computer system or another system may split stream of data 102 into substreams 104, 106, and 108 in accordance with the element/attribute names.

Once a computer system or systems have determined the pluralities of data substreams 104, 106, and 108, that computer system or another system connected in the manner described above may split stream 102 into the plurality of substreams, block 206. The substreams may be created and implemented as any number of data structures, including buffers, streams, arrays, queues, and stacks, but may be implemented in any manner known in the art. Taking the example of a series of arrays, the substream splitting process may first call a function or functions initializing an array or arrays for each of the substreams. Thus, referring to the above example, the process might initialize arrays for portions of the stream 102 representing metadata and values of the <desc>, <color>, <size> and <quan> elements. Upon initializing the arrays or other data structures representing the substreams, the substream splitting process may read the received stream of data 102 from the beginning of the stream to its end. As the process encounters portions of data, the process will store the portion in, for example, the initialized array associated with the metadata or a particular element name associated with the portion of data. Referring to the example in FIG. 4a, first the <order> tag, would be read, and would be stored at the beginning of the metadata array. Then the <product> and <desc> tags would be read, and would be stored in the next positions in the metadata array. Then, the element value "blouse" would be read and stored at the beginning of the "<desc>" array. In addition, a value indicator might be written to the structure stream indicating that an element or attribute value occurred at that position in the stream (indicated in FIG. 4a by the symbol "/"). Following that, a <color> tag would be read and stored in the metadata array, the element value "black" would be read and stored at the beginning of the "<color>" array and so on.

In some embodiments, each of the plurality of substreams 104, 106, and 108 may then be assigned one or more identifiers based on metadata describing the stream 102, block 208. The one or more identifiers may then be used to facilitate selective recombining of the substreams of data, the selective recombining described in greater detail below.

Figure 3:
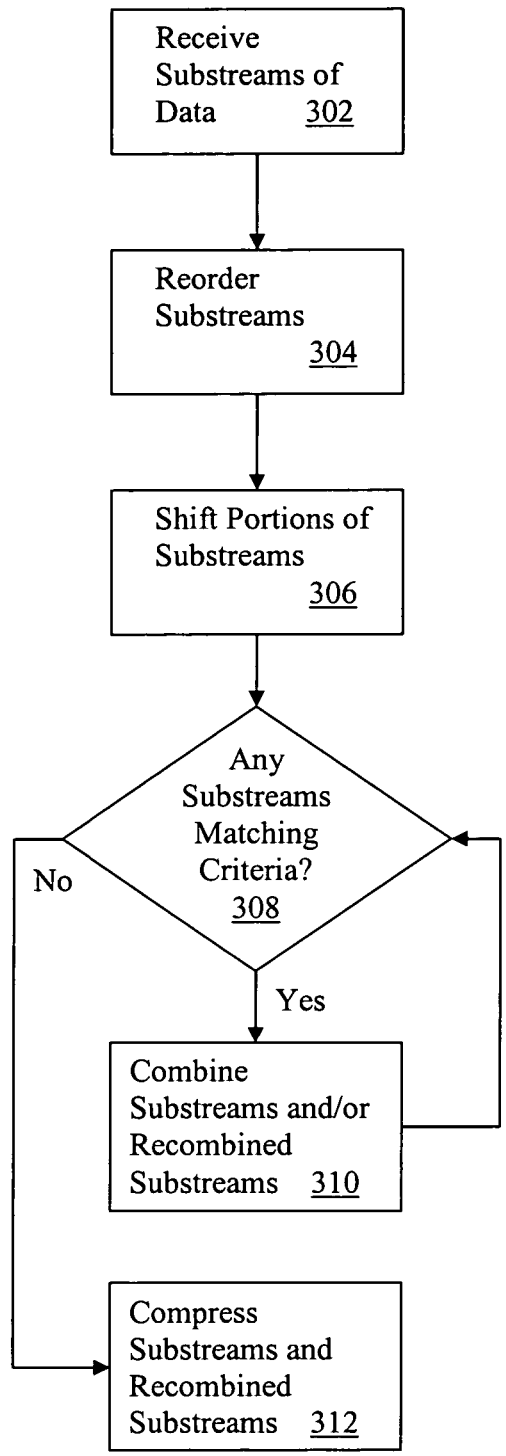
FIG. 3 illustrates a flow chart view of substream recombining and compressing operations of the present invention, in accordance with various embodiments.

FIG. 3 illustrates a flow chart view of substream recombining and compressing operations of the present invention, in accordance with various embodiments. As illustrated, the recombining processes may begin by receiving a plurality of substreams of data, block 302. This plurality of substreams may be the same plurality as that discussed above and depicted by FIG. 2 or may comprise some other plurality of substreams.

Upon receiving the plurality of substreams 104, 106, and 108, two or more of the substreams may be reordered based on one or more reordering criteria so that substreams that are likely to compress well together are adjacent, block 304. The one or more reordering criteria used for reordering two or more of the substreams may include one or more of identifiers associated with substreams, sizes associated with substreams (e.g., in bytes or number of data items), data types associated with data from substreams, names associated with data from the substream, and analysis results associated with the data of the substream, such as statistical averages of values in a substream, entropies of substreams, ranges of values in substreams, and frequency distributions of values in substreams.

In various embodiments, one or more values of one or more of the plurality of substreams 104, 106, and 108 may then be modified based on one or more criteria to improve the relative entropy of one or more pairs of substreams, block 306. For example, a constant value may be added to values in one or more sub-streams, to reduce differences in their average values, entropies, value ranges, or frequency distributions. As another example, the criteria may also comprise a map that maps each original value to a different value.

As is shown, the computer system or systems performing some or all of the operations of the present invention will then determine if any substreams 104, 106, and 108 match one or more criteria, block 308. Should any two or more of the substreams match the criterion, they may be combined to form a recombined substream 110, block 310. In various embodiments, the one or more criteria may include identifiers associated with the substreams, such as those mentioned above; sizes associated with the substreams, such as a substream's size in byte or length in values; data types associated with data from substreams; names associated with data from substreams; and analysis results of the data of the substreams, such as statistical averages of values in a substream, entropies of substreams, ranges of values in substreams, and frequency distributions of values in substreams. Substreams may be successively recombined with other adjacent or non-adjacent substreams until the one or more criteria are met. Recombined substreams themselves may be recombined with other adjacent or non-adjacent substreams or with other recombined substreams, block 310, until all substreams and recombined substreams meet the one or more criteria.

For example, if one of the one or more criteria is a substream length, the recombination process may begin by performing a function call to a method that returns a substream length. Upon determining substream lengths (methods for which are well known in the art), substreams having a length that is smaller than the criterion might be combined. If the criterion is that the length of each substream should be greater than one hundred items, for example, any substreams having a length that is less than one hundred items would be recombined into recombined substreams 110. The recombined substreams 110 themselves may be recombined, either further with other recombined substreams 110, or with substreams 104, 106, and/or 108, until all substreams and recombined substreams satisfy the substream length criteria or until only one substream remains. Referring now to the above example in FIG. 4b, if the minimum substream length is set at five, substream 2 ("<desc>") with a length of four data items and substream 3 ("<color>") with a length of four data items may be combined to form combined substream 1 with a substream length of eight data items. Further, substream 4 with a length of four data items and substream 5 with a length of four data items might also be combined to form combined substream 2 with eight data items.

Also, in various embodiments, all of the substreams may be recombined into a single recombined stream, the recombined stream compressing better than stream 102 because it now includes repeating sequences of similar adjacent items.

As is further illustrated, upon combining two or more of the substreams into the one or more recombined substreams 110, a computer system or systems may compress the substreams 108 that have not been combined, and the recombined substreams 110, block 312. Thus, the data to be compressed 112 includes both substreams that have not been recombined, and recombined substreams 110. The compression process may be facilitated by any compression algorithm known in the art, such as Huffman, Lempel-Ziv, or Deflate. These algorithms are well known to those skilled in the art, however, and the details of their implementations need not be described further. In one embodiment, a computer system or systems may determine that one or more substreams should not be compressed at all. The determination whether to compress a particular stream or substream may be made based on metadata. The metadata may be derived from a number of sources and may include identifiers associated with substreams, sizes associated with substreams (e.g., in bytes or number of data items), data types associated with data from substreams, names associated with data from the substream, and analysis results associated with the data of the substream, such as statistical averages of values in a substream, entropies of substreams, ranges of values in substreams, and frequency distributions of values in substreams.

In various embodiments, after compressing the data to be compressed 112, the computer system or systems may transmit the data 112 to another computer system (not shown) or store data 112. Such transmission or storage may be facilitated by one or more networking fabrics, such as LANs, WANs, or the Internet, or by a storage medium capable of storing the data 112. In one embodiment substreams (compressed and/or uncompressed) may be concatenated as a single stream for transmission or storage. In other embodiments, substreams may be transmitted or stored separately.

Figure 4B:
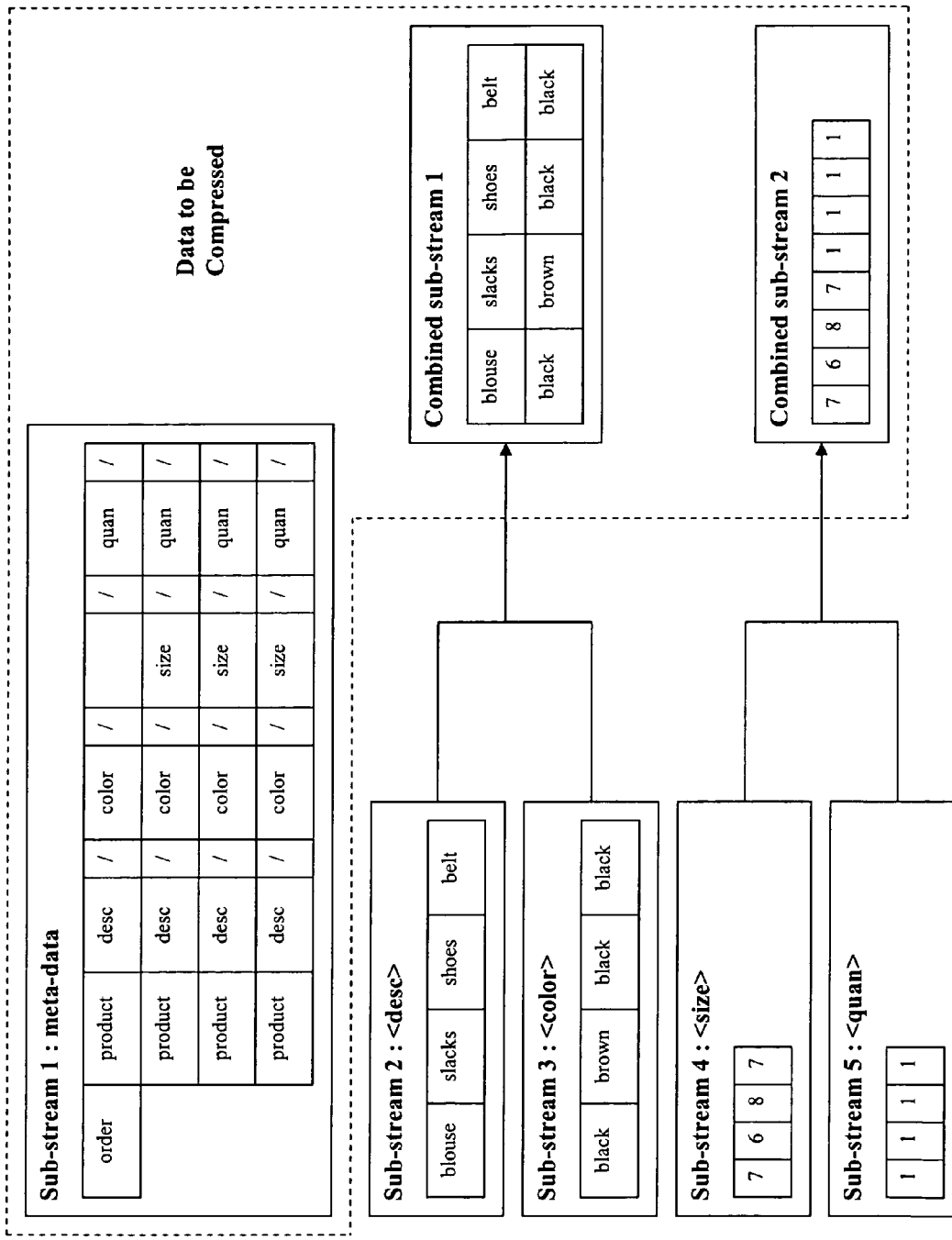

FIGS. 4a-4b illustrate exemplary substreams of data generated from the received stream of data, as well as recombined substreams generated by combining two or more of the substreams, in accordance with various embodiments.

FIG. 4a illustrates a received stream of data containing an XML document and five substreams generated from that received stream of data. Substream 1 contains a representation of metadata defining the sequence and structure of the data items in the stream of data. Each "/" symbol in substream represents a position where the associated data item might be found in another substream associated with the previous metadata item. Substreams 2 through 5 shown here have been determined based on the XML element names occurring in the stream of data, the XML element names serving as the one or more criteria. Here, substreams 2 through 5 correspond to four XML elements, "<desc>", "<color>", "<size>" and "<quan>". The criterion might specify substreams for each of these four XML elements or may specify substreams for one or more of the XML elements occurring in the document and also specify another substream for all data items not matching the one or more specified XML elements. The XML elements used to determine substreams may be provided in advance, discovered during a first pass through the stream of data or discovered incrementally while processing the stream. In fact, analysis of a mere portion might be sufficient to determine each of the XML elements present in the stream of data. Further, such a sampling analysis might be complemented by the introductions of one or more additional substreams to hold data items associated with XML elements not encountered in the sampling. Also, though the substreams shown here are organized by XML element name, substreams generated from a stream need not be. Rather, the substreams can be generated and filled at random or in accordance with some other criterion.

FIG. 4b illustrates the generated substreams depicted in FIG. 4a and discussed above, as well as a two combined substreams. Combined substream 1 was created by combining substreams 2 ("<desc>") and 3 ("<color>") based on one or more criteria. The criteria may comprise any sort of metric or requirement, such as substream length, substream size (in bytes), the data types of data in the substream, or analysis of the data in the substream. Here, a criterion shown may be a substream length, such as requiring all substreams to have a length of at least five values. Since substream 2 and substream 3 each have less than five items, both may be combined into combined substream 1. Similarly, since substream 4 and substream 5, each have less than five items, both may be combined into combined substream 2. In contrast, substream 1 (metadata) has thirty-seven items and thus would not be combined. In other examples not shown, the recombined substreams themselves may be combined, either with other recombined substreams or with the generated substreams, until all substreams and recombined substreams meet the combination criteria.

Figure 5:
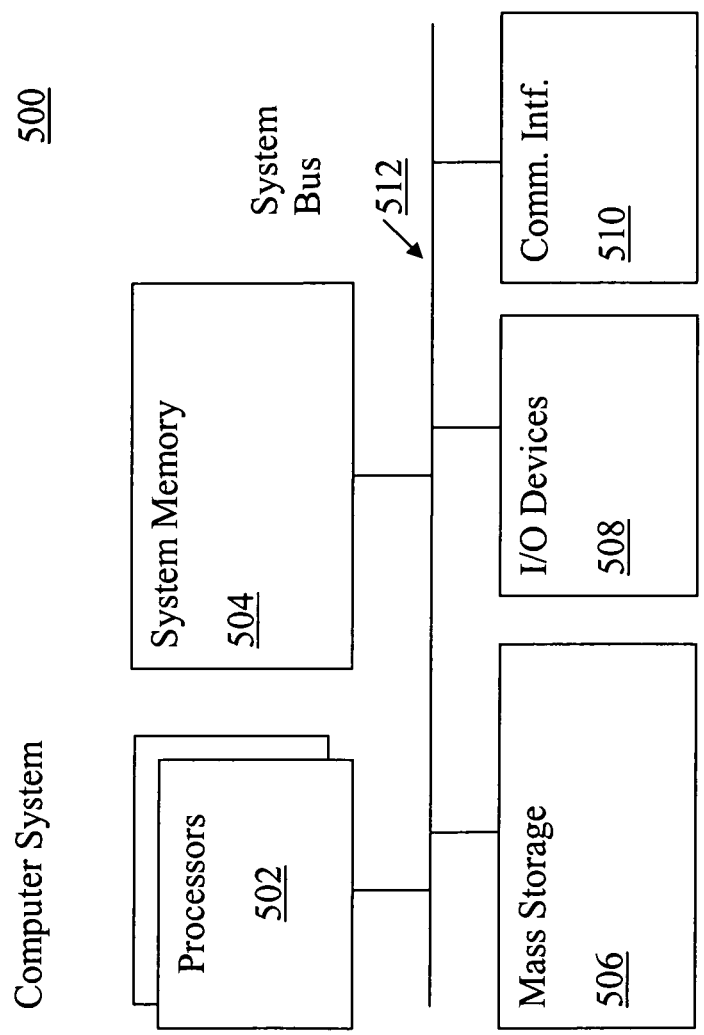
FIG. 5 illustrates an example computer system suitable for use to practice the present invention, in accordance with various embodiments.

FIG. 5 illustrates an example computer system suitable for use to practice the multiplexing and combining aspects of the present invention, in accordance with various embodiments. As shown, computer system 500 includes one or more processors 502 and system memory 504. Additionally, computer system 500 includes input/output devices 508 (such as keyboard, cursor control, and so forth). The elements are coupled to each other via system bus 512, which represents one or more buses. In the case of multiple buses, they are bridged by one or more bus bridges (not shown). Each of these elements performs its conventional functions known in the art. In particular, system memory 504 and mass storage 506 are employed to store programming modules adapted to perform the multiplexing and combining aspects of the present invention, and a permanent copy of the programming instructions implementing the programming modules adapted to perform the multiplexing and combining aspects of the present invention, respectively. The permanent copy of the instructions implementing the programming modules adapted to perform the multiplexing and combining aspects of the present invention may be loaded into mass storage 506 in the factory, or in the field, through a distribution medium (not shown) or through communication interface 510 (e.g., from a distribution server). The constitution of these elements 502-512 are known, and accordingly will not be further described.

Although specific embodiments have been illustrated and described herein, it will be appreciated by those of ordinary skill in the art that a wide variety of alternate and/or equivalent implementations may be substituted for the specific embodiments shown and described, without departing from the scope of the present invention. This application is intended to cover any adaptations or variations of the embodiments discussed herein. Therefore, it is manifestly intended that this invention be limited only by the claims and the equivalents thereof.

What is claimed is:

1. A method for streaming encoded values representing a stream of data, the method comprising:
   receiving by a device a stream of encoded values representing the stream of data for transmission;
   splitting the stream of encoded values, by the device, into a plurality of substreams based on first one or more criteria to improve compression of the received stream of encoded values, wherein:
      the first one or more criteria includes a criteria associated with metadata describing one or more of structure, names, types, or content of data items in the stream of encoded values;
      after splitting, each of the plurality of substreams differs from other substreams in the plurality of substreams by one or more of structure, names, types, or content of data items in the substreams and is assigned one or more identifiers based on the metadata; and
      at least one of the plurality of substreams comprises one or more representations of the metadata describing the stream of encoded values;
   matching, by the device, one or more second criteria that are different from the first criteria, the one or more second criteria including the assigned identifiers for the plurality of substreams, wherein the assigned identifiers include at least one or more of substream size, substream length, data types associated with data from the substreams, or results of analysis of the data in the substreams;
   when two or more of the substreams match one or more of the second criteria, selectively recombining, by the device, a portion of the plurality of substreams based on the second one or more criteria to further improve compression of the received stream of encoded values; and
   compressing, by the device, the resultant plurality of substreams that have not been recombined, and the recombined substreams for transmission as a single stream.

2. The method of claim 1, further comprising deriving, by the device, the metadata from one or more descriptions of the encoded values.

3. The method of claim 1, further comprising deriving, by the device, the metadata from at least one selected from the group consisting of an XML Document, an XML Schema, a database schema, a grammar, and a programming language.

4. The method of claim 1, further comprising assigning to each substream, by the device, the one or more identifiers based on the metadata.

5. A method comprising:
   receiving, by a device, a plurality of substreams of data, said plurality of substreams of data split from a stream of data for transmission based on first one or more criteria, the first one or more criteria selected to improve compression of the stream of data, wherein:
      the first one or more criteria include a criteria associated with metadata describing one or more of structure, names, types, or content of data items in the stream of data;
      each of the plurality of substreams differs from other substreams in the plurality of substreams by one or more of structure, names, types, or content of data items in the substreams and is assigned one or more identifiers based on the metadata; and
      at least one of the plurality of substreams comprises one or more representations of the metadata describing the stream of data; and
   selectively recombining the plurality of substreams of data by the device for compression prior to transmission, wherein the recombining is based on matching second one or more criteria to further improve compression of the stream of data, wherein:
      the second one or more criteria are different from first one or more criteria and include the one or more assigned identifiers;
      the assigned identifiers include at least one or more of substream size, substream length, data types associated with data from the substreams, or results of analysis of the data in the substreams; and
      the recombining includes, when two or more of the substreams match one or more of the second criteria, reordering the plurality of substreams so that substreams of data that are likely to compress well together are adjacent to each other.

6. The method of claim 5, wherein the second one or more criteria is selected may also include a statistical average of values in a substream, an entropy of a substream, a range of values in a substream, and a frequency distribution of values in a substream.

7. The method of claim 6, where said analysis result of the data of the substream is one or more selected from the group consisting of statistical averages of values in a substream, entropies associated with substreams, ranges of values in substreams and frequency distributions of values in substreams.

8. The method of claim 5, wherein said selectively recombining comprises successively re-combining selected ones of the substreams to form a recombined substream based on said one or more second criteria, wherein the successively re-combining continues until the recombined substream meets one or more additional criteria.

9. The method of claim 8, wherein said selectively recombining further comprises successively recombining the recombined substream with one or more other recombined substreams based on said one or more second criteria to form still another recombined substream, wherein the successive recombining of the recombined substreams continues until the still another recombined substream meets another one or more additional criteria.

10. The method of claim 5, wherein said selectively recombining comprises modifying one or more portions of one or more substreams based on said one or more second criteria to improve relative entropy of one or more combined substreams.

11. The method of claim 10 wherein said modifying comprises one or more of adding a constant value to values in one or more substream, and mapping sets of values in one or more substreams to different values.

12. The method of claim 5, further comprising separately compressing, by the device, some or all of the recombined and not recombined substreams.

13. The method of claim 12, wherein the compressing is facilitated by a compression algorithm, and the compression algorithm is one of Huffman, Lempel-Ziv, and/or Deflate.

14. An apparatus comprising:
a processor; and
one or more modules to be operated by the processor to
receive a stream of encoded values for transmission;
split the stream of encoded values into a plurality of substreams based on first one or more criteria, the first criteria selected to improve compression of the received stream of encoded values, wherein:
the first one or more criteria includes a criteria associated with metadata describing one or more of structure, names, types, or content of data items in the stream of encoded values;
after splitting, each of the plurality of substreams differs from other substreams in the plurality of substreams by one or more of structure, names, types, or content of data items in the substreams and is assigned one or more identifiers based on the metadata; and
at least one of the plurality of substreams comprises one or more representations of the metadata describing the stream of encoded values;
match one or more second criteria that are different from the first criteria, the one or more second criteria including the assigned identifiers for the plurality of substreams, wherein the assigned identifiers include at least one or more of substream size, substream length, data types associated with data from the substreams, or results of analysis of the data in the substreams;
when two or more of the substreams match one or more of the second criteria, selectively recombine a portion of the plurality of substreams based on second one or more criteria to further improve compression of the stream of encoded values; and
compressing the resultant plurality of substreams that have not been recombined, and the recombined substreams for transmission as a single stream.

15. The apparatus of claim 14, wherein the one or more modules are further to be operated to derive the metadata from at least one selected from the group consisting of the data itself, one or more descriptions of the stream of data, an XML Document, an XML Schema, a database schema, a grammar, and a programming language.

16. The apparatus of claim 14, wherein the one or more modules are further to be operated to assign each substream the one or more identifiers based on the metadata.

17. An apparatus comprising:
a processor; and
one or more modules to be operated by the processor to:
receive a plurality of substreams of data, said substreams split from a stream of data for transmission based on first one or more criteria, the first one or more criteria selected to improve compression of the stream of data, wherein:
the first one or more criteria include a criteria associated with metadata describing one or more of structure, names, types, or content of data items in the stream of data;
each of the plurality of substreams differs from other substreams in the plurality of substreams by one or more of structure, names, types, or content of data items in the substreams and is assigned one or more identifiers based on the metadata; and
at least one of the plurality of substreams comprises one or more representations of the metadata describing the stream of data; and
selectively recombine the substreams for compression prior to transmission, wherein the recombine is based on second one or more criteria to further improve compression of the streams of data, wherein:
the second one or more criteria are different from the first one or more criteria and include the one or more assigned identifiers;
the assigned identifiers include at least one or more of substream size, substream length, data types associated with data from the substreams, or results of analysis of the data in the substreams; and
the recombine includes, when two or more of the substreams match one or more of the second criteria, reordering the plurality of substreams so that substreams that are likely to compress well together are adjacent to each other.

18. The apparatus of claim 17, wherein the second one or more criteria are selected may include one or more statistical averages of values of one or more substreams, one or more entropy measures of one or more substreams, one or more ranges of values of one or more substreams, and one or more frequency distributions of values of one or more substreams.

19. The apparatus of claim 17, wherein the one or more modules are further to be operated to selectively recombine the substreams, and selectively recombining comprises successively re-combining selected ones of the substreams to form a recombined substream based on said one or more second criteria, wherein the successively re-combining continues until the recombined substream meets one or more additional criteria.

20. The apparatus of claim 19, wherein the one or more modules are further to be operated to selectively recombine the substreams, and selectively recombining further comprises successively recombining the recombined substream with one or more other recombined substreams based on said one or more criteria to form still another recombined substream, wherein the successive recombining of the recombined substreams continues until the still another recombined substream meets another one or more additional criteria.

21. The apparatus of claim 17, wherein the one or more modules are further to be operated to selectively recombine the substreams, and selectively recombining comprises shifting one or more portions of one or more substreams based on said one or more second criteria to improve relative entropy of one or more adjacent pairs of substreams.

22. The apparatus of claim 17, wherein the compressing is facilitated by a compression algorithm, and the compression algorithm is one of Huffman, Lempel-Ziv, and/or Deflate.

23. One or more computer-readable media containing instructions written thereon that, in response to execution on a computing device, cause the computing device to:
receive a stream of encoded values representing the stream of data for transmission;
split the stream of encoded values into a plurality of substreams based on first one or more criteria to improve compression of the received stream of encoded values, wherein:

the first one or more criteria includes a criteria associated with metadata describing one or more of structure, names, types, or content of data items in the stream of encoded values;

after splitting, each of the plurality of substreams differs from other substreams in the plurality of substreams by one or more of structure, names, types, or content of data items in the substreams and is assigned one or more identifiers based on the metadata; and at least one of the plurality of substreams comprises one or more representations of the metadata describing the stream of encoded values;

match one or more second criteria that are different from the first criteria, the one or more second criteria including the assigned identifiers for the plurality of substreams, wherein the assigned identifiers include at least one or more of substream size, substream length, data types associated with data from the substreams, or results of analysis of the data in the substreams;

when two or more of the substreams match one or more of the second criteria, selectively recombine a portion of the plurality of substreams other than the at least one of the plurality of substreams that comprises one or more representations of the metadata describing the stream of encoded values, the selectively recombine being based on the second one or more criteria to further improve compression of the received stream of encoded values; and compress the resultant plurality of substreams that have not been recombined, and the recombined substreams for transmission as a single stream.

* * * * *